(12) United States Patent
Chitre et al.

(10) Patent No.: US 6,839,330 B1
(45) Date of Patent: Jan. 4, 2005

(54) METHOD AND APPARATUS FOR IMPROVING ASYNCHRONOUS TRANSFER MODE OPERATION OVER NOISY, HIGH SPEED WIRELESS LINKS

(75) Inventors: Dattakumar M. Chitre, Silver Spring, MD (US); Anil K. Agarwal, Gaithersburg, MD (US); Prabhakar Gowrisankaran, Andover, MA (US); John A. Lunsford, Gaithersburg, MD (US); Sathyanarayanan Narayanaswamy, Chicago, IL (US)

(73) Assignee: Viasat, Inc., Carlsbad, CA (US)

( * ) Notice: Subject to any disclaimer, the term of this patent is extended or adjusted under 35 U.S.C. 154(b) by 0 days.

(21) Appl. No.: 09/462,895

(22) PCT Filed: Jul. 15, 1998

(86) PCT No.: PCT/US98/14195

§ 371 (c)(1),
(2), (4) Date: Apr. 3, 2000

(87) PCT Pub. No.: WO99/04339

PCT Pub. Date: Jan. 28, 1999

Related U.S. Application Data

(60) Provisional application No. 60/052,539, filed on Jul. 15, 1997.

(51) Int. Cl.$^7$ .............................................. H04B 7/212
(52) U.S. Cl. ..................... 370/310.1; 370/474; 370/477
(58) Field of Search ........................... 370/310.1, 310.2, 370/338, 349, 350, 389, 394, 395.1, 400, 401, 468, 470, 471, 474, 477, 503, 506, 509, 514, 516; 375/362–364

(56) References Cited

U.S. PATENT DOCUMENTS

| | | | |
|---|---|---|---|
| 4,346,470 A | | 8/1982 | Alvarez, III et al. |
| 5,282,207 A | * | 1/1994 | Jurkevich et al. ............. 370/468 |
| 5,285,441 A | * | 2/1994 | Bansal et al. ................. 370/218 |
| 5,293,379 A | * | 3/1994 | Carr ............................ 370/474 |
| 5,341,376 A | * | 8/1994 | Yamashita ..................... 370/466 |
| 5,425,101 A | * | 6/1995 | Woo et al. ..................... 380/212 |
| 5,434,854 A | | 7/1995 | Focarile et al. |
| 5,440,547 A | * | 8/1995 | Easki et al. ............... 370/395.3 |
| 5,444,743 A | * | 8/1995 | Scarpa ......................... 375/368 |
| 5,528,590 A | * | 6/1996 | Iidaka et al. ............ 370/395.65 |
| 5,553,069 A | | 9/1996 | Ueno et al. |
| 5,557,609 A | * | 9/1996 | Shobatake et al. ...... 370/395.71 |
| 5,570,362 A | * | 10/1996 | Nishimura .................... 370/466 |
| 5,600,653 A | * | 2/1997 | Chitre et al. ................. 370/474 |
| 5,608,738 A | * | 3/1997 | Matsushita .................... 714/752 |
| 5,650,825 A | * | 7/1997 | Naimpally et al. .......... 348/465 |
| 5,657,316 A | * | 8/1997 | Nakagaki et al. ............ 370/394 |
| 5,684,791 A | * | 11/1997 | Raychaudhuri et al. ... 370/310.2 |
| 5,892,770 A | * | 4/1999 | Wolf et al. ................... 370/468 |

* cited by examiner

*Primary Examiner*—Huy D. Vu
*Assistant Examiner*—Daniel Ryman
(74) *Attorney, Agent, or Firm*—Sughrue Mion, PLLC

(57) ABSTRACT

A method for encoding ATM cells for transmission over a wireless link comprising the steps of receiving an ATM cell stream comprised of a plurality of ATM cells and detecting idle/unassigned cells within the cell stream. Then, a header frame made up of headers of a number of the plurality of ATM cells is assembled, together with a payload frame made up of payloads of a number of the plurality of ATM cells. Finally, some of the detected idle/unassigned cells are placed in a selected portion of the payload frame.

16 Claims, 7 Drawing Sheets

METHOD AND APPARATUS FOR IMPROVING ASYNCHRONOUS TRANSFER MODE OPERATION OVER NOISY, HIGH SPEED WIRELESS LINKS

The present application, is based upon U.S. Provisional Application No. 60/052,539 filed Jul. 15, 1997, which is incorporated herein by reference.

BACKGROUND OF THE INVENTION

The present invention relates to high quality of service transmission of Asynchronous Transfer Mode (ATM) information over noisy, high speed wireless links. More specifically, the invention relates to protecting ATM cells transmitted over high speed wireless channels using framing, interleaving and forward error correction coding schemes to correct burst errors.

Asynchronous Transfer Mode (ATM) is a method for transmitting information via a broadband Integrated Services Digital Network (B-ISDN). ATM is a transfer mode which uses fixed size data units, known as cells, made up of 53 bytes; 48 of these bytes contain data (referred to as the information field or payload) and 5 contain overhead (referred to as the cell header). The data bytes correspond to the ATM Adaptation Layer (AAL) and the overhead bytes define the ATM cell header. The header includes cell routing information and an error detection/correction mechanism to protect the routing information. Also included in the AAL is an error detection mechanism to mitigate against transmission errors in the AAL data.

In principle, ATM cells may be transported using any digital transmission format. However, the International Telecommunication Union (ITU) approved synchronous digital hierarchy (SDH) and plesiochronous digital hierarchy (PDH) signal formats are of particular interest from an international standardization viewpoint. An important feature in SDH transmission is the inclusion of pointer bytes which are used to indicate the location of the first byte in the payload of a SDH frame and also avoid slips and their associated data loss due to slight phase or frequency variations between the SDH payload and frame. ATM cell transmission via SDH further incorporates a cell delineation mechanism for acquisition and synchronization of ATM cells on the receiving side of the network. There exist, however, a number of factors which present problems when transmitting ATM cells in SDH and PDH formats over wireless links.

Transmission considerations and performance criteria for both ATM and its carriage in the SDH and PDH frames are currently based on the assumption that transmission bit errors are randomly distributed. This assumption is generally valid for most optic fiber based transmission systems. However, due to the necessity of including channel coding into wireless transmissions to reduce receiving station size, such as in satellite channels for example, and thereby minimize ground segment costs, transmission bit errors in a wireless environment are likely to occur in bursts.

Furthermore, ATM protocols assume that the transmission medium has very low Bit Error Rates ($10^{-12}$ or better) and that bit errors occur randomly. Most satellite and wireless links have much worse Bit Error Rate characteristics ($10^{-6}$ to $10^{-8}$) and errors tend to occur in long bursts, especially when Viterbi coding is used in the modems.

These factors have a severe effect on ATM protocols and applications that use ATM. For example, ATM cells use a feature to correct single bit errors in the cell header. This feature is useless in the satellite and wireless bursty error environments, with the net result being that the cell headers of a large number of cells can get corrupted, leading to cell losses or misinsertions.

Therefore, in wireless environments, such as satellite communications, the bursty nature of transmission errors requires a careful evaluation of transmission performances of both the SDH or PDH transport signal and the ATM cells contained therein.

U.S. Pat. No. 5,600,653 teaches a technique to solve the problem of cell losses by selectively interleaving the ATM cell headers. The interleaving and deinterleaving of cell headers distributes the possible burst of errors in the ATM cell header over a number of cell headers such that no ATM cell header would have more than one bit in error. A Header Error Correction (HEC) algorithm is then used to correct the one bit error occurrences in all ATM cell headers thereby reducing the ATM cell loss to an acceptable level. This technique, however, does not address the problem of high ATM cell error ratio (CER) characteristics present in wireless links.

SUMMARY

The present invention is directed to and apparatus and methods for protecting ATM cells transmitted over high speed wireless channels by correcting burst errors.

The apparatus of the present invention is a transmitter/receiver which receives an ATM cell stream sequence via a terrestrial wireline link and encoding the ATM cell stream for transmission of data via a wireless link, such as a satellite link. In addition, the apparatus also receives and decodes encoded wireless data received via the wireless link and transmits an ATM cell stream sequence via the wireline link.

Included in the apparatus is a terrestrial interface which receives ATM cell stream sequence data from the terrestrial wireline link. Additionally, this interface is also used to transmit data received via the wireless link over the terrestrial link. An encoder receives cell stream data from the terrestrial interface and encodes this data with a coding scheme, such as Reed-Solomon coding. The encoder is, in turn, connected to a wireless or satellite interface which receives the encoded data and transmits it over the wireless link.

Further, a decoder is also included in order to decode encoded data received via the wireless interface from a similar apparatus which encoded the data. In addition, a control unit (ALECPU) is included to provide control of the interfaces, encoder and decoder.

A method employed by the above apparatus for protecting ATM cells includes dropping a Header Error Correction byte from a header of each ATM cell at a transmitting end of a wireless link and using a byte space left unoccupied by the dropped Header Error Correction byte to transmit other information.

Another method for protecting ATM cells includes assembling a header frame in an arrangement made up of headers of a predetermined number of ATM cells received from an incoming ATM cell stream over a wireline link. The header frame is further partitioned into two sections. A further method includes assembling a payload frame made up of payloads of a predetermined number of ATM cells.

Another method of protective encoding includes first receiving an ATM cell stream consisting of a plurality of ATM cells from a wireline interface. The idle/unassigned cells within the cell stream are then detected. Next, a payload frame made up of payloads from said plurality of ATM cells having a plurality of columns is assembled, the assembly including placing up to a predetermined number of the detected idle/unassigned cells in a selected portion of the payload frame.

Yet another method includes setting a first information field within a frame at a first state when any idle/unassigned cells are being used for extra error correction code. If no idle/unassigned cells are used for extra error correction, the first information field is set at a second state. In addition, the number of idle/unassigned cells used for extra error correction code is stored in a second information field within the frame when the first information field has been set at the first state.

A further method of protecting ATM cells includes flagging a first nibble occurring in a plurality of ATM frames received from the wireline interface. Header and payload frames are then assembled for transmission over a wireless link and consist of a predetermined number of ATM cells derived from the plurality of ATM frames. A position of each said first flagged nibble encountered in each said predetermined number of ATM cells is recorded in control bytes contained in the header frame; and overhead parity bits occurring in each of the plurality of ATM frames are stored in control bytes contained in said header frame.

In addition, a method for protecting ATM cells includes recording the original positions of idle/unassigned cells in a cell stream sequence before being moved during assembly of an ATM frame prior to transmission of said frame over said wireless link. The original positions of the idle/unassigned cells are then restored within said cell stream based upon the recorded original positions after transmission of the frame over a wireless link.

The above and other features of the invention including various and novel details of construction and combination of parts will now be more particularly described with reference to the accompanying drawings and pointed out in the claims. It will be understood that the particular methods of protecting ATM cells transmitted over wireless links embodying the invention are shown by way of illustration only and not as a limitation of the invention. The principles and features of this invention may be employed in varied and numerous embodiments without departing from the scope of the invention.

BRIEF DESCRIPTION OF THE DRAWINGS

The invention will be more clearly understood from the following detailed description in conjunction with the accompanying drawings, wherein.

DETAILED DESCRIPTION OF THE PREFERRED EMBODIMENTS

The present invention is directed to methods of protecting ATM cells transmitted over high speed wireless links using framing, interleaving and forward error correction coding schemes to correct burst errors.

The implementation of the methods of the present invention to be described herein are accomplished via an apparatus referred to as an ATM Link Enhancer (ALE). The particular ALE described herein is suitable for the case of transmission of ATM cells at DS3 (44.786 Mbps) rates over a wireless satellite link. The present implementation of the invention can, however, be applied equally well for transmission of ATM cells at different rates.

Figure 1:
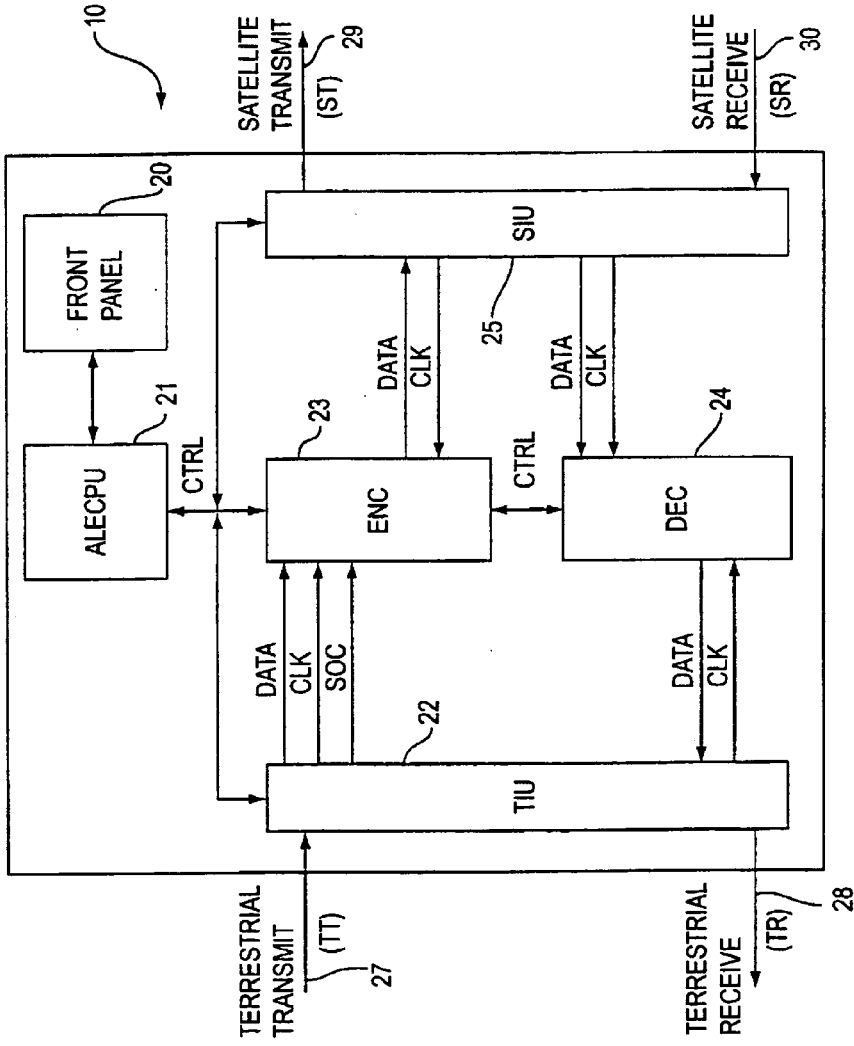
FIG. 1 is a block diagram of an ALE architecture used to implement the present invention.

FIG. 1 illustrates the architecture of the ALE, shown generally at 10, which is comprised of six blocks; a Front Panel (FP) 20, a Central Processing Unit (ALECPU) 21, a Terrestrial Interface Unit (TIU) 22, an Encoder (ENC) 23, a Decoder (DEC) 24 and a Satellite Interface Unit (SIU) 25.

The ALECPU 21 configures the TIU 22 and SIU 25 to operate at a user specified interface rate. In addition, the ALECPU receives and collects performance monitoring data is listed in Table 1 concerning the Terrestrial Transmit (TT) 27 and Satellite Receive (SR) 30 streams from the TIU 22 and SIU 25, respectively. Moreover, the ALECPU 21 software and hardware includes debug capabilities such as writing specific patterns to system memories (not shown), checking system memory integrity and access to internal registers through an Operator Console (not shown). The ALECPU has the capability to communicate with the Operator Console over a serial link or an Ethernet.

TABLE 1

| Performance Monitoring | | |
|---|---|---|
| Error | DS3 | E3 |
| CP bit errors | Y | N |
| P bit errors | Y | N |
| Framing errors | Y | ? |
| FEBE events | Y | Y (TT only) |
| Line code violations | Y | Y |
| Cells with one header error (TT only) | Y | Y |
| Cells with multiple header errors (TT only) | Y | Y |

Figure 9:
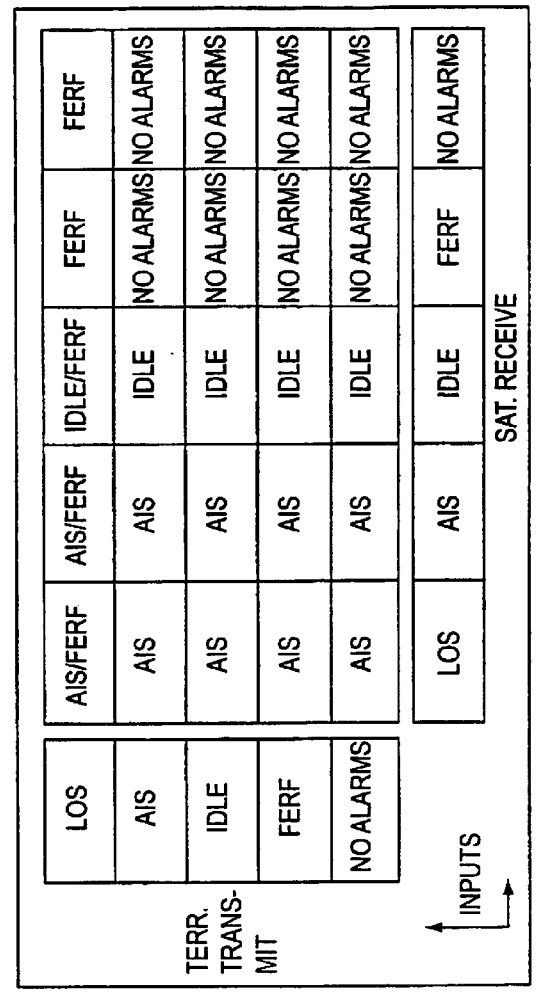
FIG. 9 illustrates a Satellite Transmit alarm response matrix.
Figure 10:
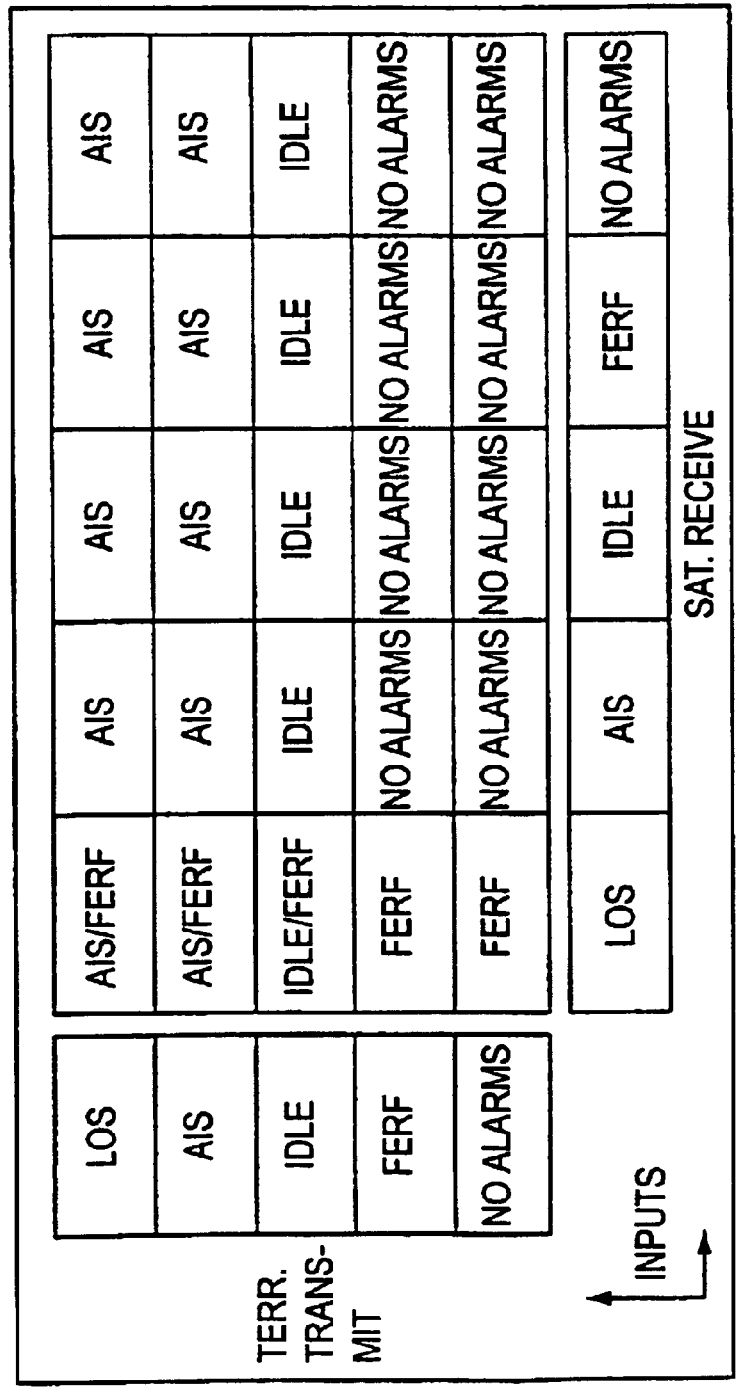
FIG. 10 illustrates a Terrestrial Received alarm response matrix.

The ALECPU further receives information about alarms detected on the TT and SR streams form the TIU and SIU. The ALECPU instructs the TIU and SIU to generate the alarm responses on the ST and TR streams, for the detected alarm conditions, based on the matrices shown in FIGS. 9 and 10, respectively.

The ALECPU also reads system parameters set by a user through the Front Panel 20 and configures the hardware based on these parameters. For example, the user can choose between idle cells or unassigned cells for extra payload protection. The idle cells are defined as cells with the header 0x00 0x00 0x00 0x00 0x00. Unassigned cells are defined as cells with the header bin "yyyy0000" 0x00 0x00 0x00bin "0000xxx1". In addition, the user can choose to correct 1 bit header errors on the ATM cells arriving in the TT stream. Another feature is that the user can choose to replace ATM cells having multiple header errors which arrive in the TT stream with idle/unassigned cells.

The TIU 22 provides the interface between the Encoder (ENC) 23, Decoder (DEC) 24 and the terrestrial network (e.g., Terrestrial Transmit (TT) 27 and Terrestrial Receive (TR) 28). TIU 22 interfaces to the TT and TR streams (27 and 28) at a DS3 rate, with direct-mapped ATM cells. It is noted, however, that the TIU could also be used with ATM Physical Layer Convergence Protocol (PLCP) mapped ATM cells. In addition, the TIU 22 extracts the cell data from the received DS3 frames on the TT stream 27 and assembles the cell data received from DEC 24 to transmit DS3 frames on the TR stream 28.

The TIU 22 receives (and transmits) a B3ZS encoded, Alternate Mark Inversion (AMI) signal at DS3 or an HD3B encoded, AMI signal at E3 from (to) the TT (TR) stream on a 75 ohm coaxial cable. The TIU supports a cable length of 0–450 feet on both the TT and TR streams (27 and 28). The TIU 22 has been designed as an interchangeable module to allow the user to switch between DS3 and E3. The change from one rate to another can be accomplished without any physical change to the rest of the system.

The TIU 22 is also interfaced with the SIU 25 such that the Satellite Transmit (ST) stream 29 is phase locked to the TT stream 27 and the aggregate cell transfer rate is the same on both streams. Likewise, the TR stream 28 is phase locked to the Satellite Receive (SR) stream 30 and the aggregate cell transfer rate is the same on both streams.

In operation, TIU 22 processes the received TT stream 27 and extracts the payload from the DS3 frame. The TIU 22 then implements a Cell Delineation Algorithm as specified in ITU I.432 to delineate the ATM in the DS3 payload. Delineated cell data is, in turn, transferred to ENC 23. As will be discussed later, another function of the TIU 22 is to flag the first nibble extracted from the payload of every DS3 frame for use in the ENC 23. In addition, in DS3 operation, the TIU extracts the CP overhead (ITU G.804) bit from the DS3 frames on the TT stream 27 and transfers these bits to the ENC 23. Further, the TIU 22 transmits the TR stream 28 by assembling cell data received from the DEC 24 into a DS3 frame. In DS3 operation, the TIU 22 receives CP bits from the DEC and inserts these into the DS3 overhead on the TR stream 28.

In D53 operation, the TIU 22 extracts the overhead bits listed below from the DS3 frames on the TT stream 27. The extracted overhead is then transferred by the ALECPU 21 to the SIU 25 and is then transmitted on the ST stream 29.

C13 Far-End Alarm Control bit (ITU G.804) 1 bit
C51–53 Path maintenance data link bits (ITU G.804) 3 bits In E3 operation, the TIU 22 extracts the overhead bits listed below from the E3 frames on the TT stream 27. The extracted overhead is then transferred by the ALECPU 21 to the SIU 25 and is then transmitted on the ST stream 29.

NR Network Operator byte (ITU G.832) 8 bits
GC General purpose communication link (ITU G.832) 8 bits
TR Trail Trace (ITU G.832) 8 bits
TM Timing Marker (ITU G.832) 1 bit In DS3 operation, the TIU 22 receives the overhead bits listed below from the ALECPU 21 and transmits them in the DS3 frame overhead on the TR stream 28. The ALECPU 22 transfers these bits from the SIU 25, which extracts them from the SR stream 30.

C13 Far End Alarm Control bit (ITU G.804) I bit
C51–53 Path maintenance data link (ITU G.804) 3 bits In E3 operation, the TIU 22 receives the overhead bits listed below from the ALECPU 21 and transmits them in the E3 frame overhead on the TR stream 28. The ALECPU 21 transfers these bits from the SIU 25, which extracts them from the SR stream 30.

NR Network Operator byte (ITU G.832) 8 bits
GC General purpose communication link (ITU G.832) 8 bits
TR Trail Trace (ITU G.832) 8 bits
TM Timing Marker (ITU G.832) I bit Additionally, the TIU 22 measures the performance monitoring data specified in Table 1, and the data is read every second by the ALECPU 21. Furthermore, the TIU 22 detects the following alarms on the TT stream 27: LOS, OOF, AIS, Idle and FERF. Subsequently, the TIU 22 transfers this alarm information to the ALECPU 21. The TIU 22 can also generate the following alarms on the TR stream 28 (as instructed by the ALECPU 21): AIS, Idle and FERF.

Finally, the TIU 22 detects the presence of any errors in the headers of ATM cells received on the TT stream 27 by either correcting 1 bit header errors and/or replacing cells with multiple header errors with idle/unassigned cells.

Figure 2:
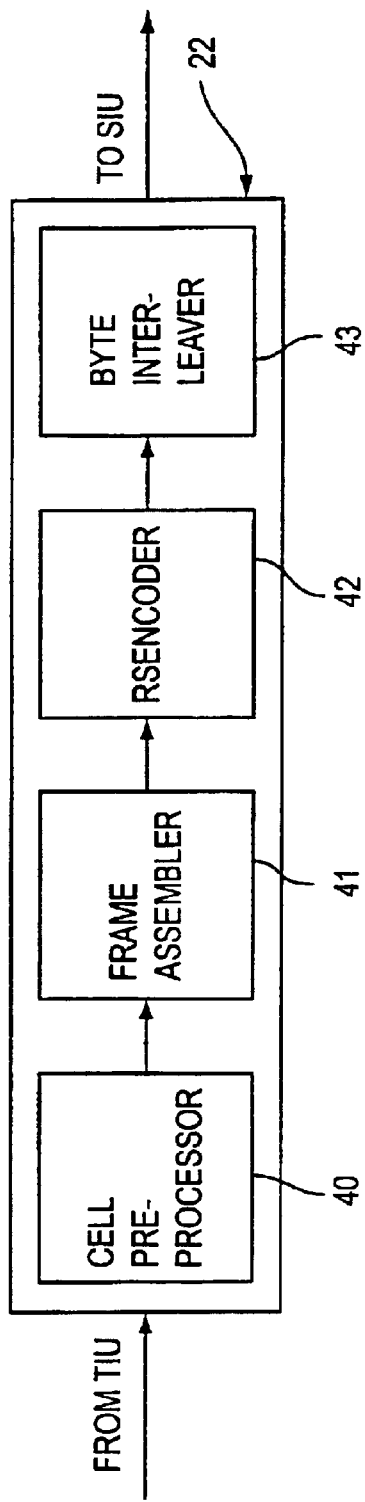
FIG. 2 is a block diagram of the components of the Encoder used in the ALE of FIG. 1.

The Encoder (ENC) 23, which is used to encode terrestrial signals for transmission over satellite wireless links, is further shown in FIG. 2 partitioned into its various components. A Cell PreProcessor 40 receives cell data from the TIU 22 and, in turn, monitors the header bytes of all the incoming cells and detects idle/unassigned cells. Upon detection of idle/unassigned cells, the Cell Preprocessor 40 signals the Frame Assembler 41. The Frame Assembler 41 receives the cell data and idle/unassigned cell detection signal from the Cell PreProcessor 40 and assembles an ALE frame of 121 ATM cells according to the methods which will be described herein, including storing the incoming cells into the ALE frame comprised of a Header Frame having two sections and a Payload Frame, dropping a Header Error Correction (HEC) byte from each of the cells in the frame, pushing idle/unassigned cells to the end of the ALE frame and storing the sequence numbers of these moved idle/unassigned cells in header byte 1, and executing end to end overhead protection of C-bit Parity bits (CP bits). In addition, the Frame Assembler 41 monitors the idle/unassigned cell detection signal from the Cell Preprocessor 40. If this signal is received the Frame Assembler increments a count of the number of idle/unassigned cells (ICNUM) and stores this number in header byte 2 of the 121st cell of the frame if ICNUM is greater than zero.

Included in ENC 23 is RSEncoder 42 which receives the ALE frame and ICNUM from the Frame Assembler 41 and generates a 10 byte Header Error Correction Code (HECC) and a 4 to 20 byte (depending on ICNUM) Payload Error Correction Code (PECC) through use of a Reed-Solomon coding scheme to be added to the Header and Payload Frames, respectively. These methods of generating and adding Error Correction Codes (ECC), as performed by the RSEncoder 42, are more fully discussed later.

Additionally, ENC 23 includes a Byte Interleaver 43 which receives the cell data and ECC from the RSEncoder 42 and, in turn, appends a two byte Sync pattern to the start of the ALE frame. The Byte Interleaver 43 then interleaves and transmits the frame via the SIU 25.

Figure 3:
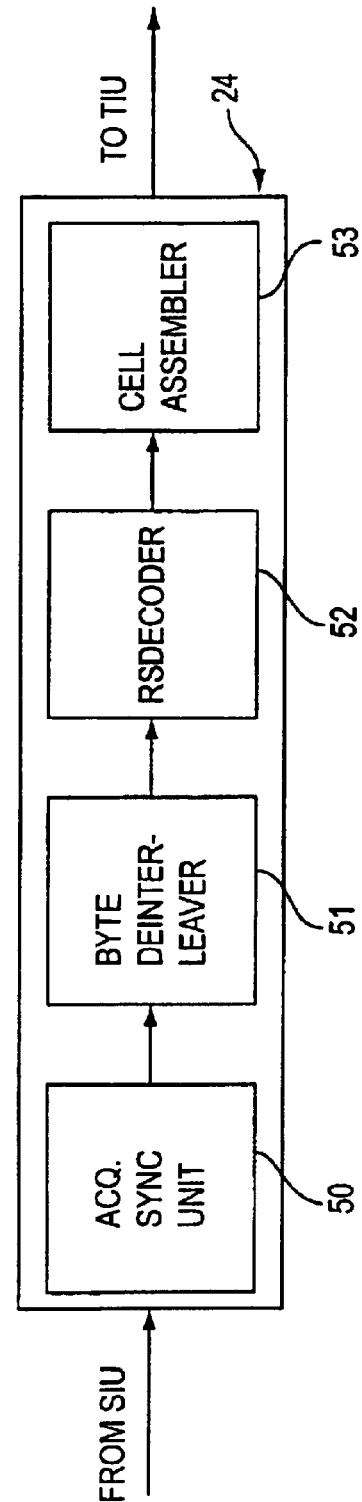
FIG. 3 is a block diagram of the components of the Decoder used in the ALE of FIG. 1.

Decoder (DEC) 24 deinterleaves ATM cell data received from the Satellite Receive (SR) stream 30, decodes the ECC and checks and corrects errors in the data. It then reassembles the corrected cell data and transfers it to the TIU for transmission on the TR stream. DEC 24 also extracts CP bits from the ALE frame and inserts them in the DS3 overhead on the TR stream. The Decoder (DEC) 24 is shown in FIG. 3 partitioned into its various components. These components are comprised of an Acquisition and Synchronization Unit (ASU) 50, a Byte Deinterleaver 51, a RSDecoder 52 and a Cell Assembler 53. The DEC is first used to acquire and maintain the start of an ALE frame for correct operation.

Finally, referring back to FIG. 1, SIU 25 provides the interface between the Encoder (ENC) 23, Decoder (DEC) 24 and the satellite side (e.g., Satellite Transmit (ST) 29 and Satellite Receive (SR) 30). SIU 25 interfaces to the ST and SR streams (29 and 30) at a DS3 rate. SIU 25 extracts ALE frame data from the received DS3/E3 frames on the SR stream 30 and assembles ALE frame data received from ENC 23 to transmit DS3/E3 frames on the ST stream 29. As discussed previously with respect to the TIU 22, the SIU 25 is also interfaced with the TIU 22 such that the Satellite Transmit (ST) stream 29 is phase locked to the TT stream 27 and the aggregate cell transfer rate is the same on both streams. Likewise, the TR stream 28 is phase locked to the SR stream 30 and the aggregate cell transfer rate is the same on both streams.

The SIU 25 receives (transmits) a B3ZS encoded, Alternate Mark Inversion (AMI) signal at DS3 or an HDB3 encoded, AMI signal at E3 from (to) the Satellite Receive (Satellite Transmit) stream on a 75 ohm coaxial cable. SIU 25 supports a cable length of 0–450 feet on both ST and SR streams (29 and 30).

In addition, the SIU 25 has been designed as an interchangeable module to allow the user to switch between DS3 and E3. The change from one rate to another can be accomplished without any physical change to the rest of the system. The SIU 25 transmits the ST stream 29 by assembling ALE frame data received from the ENC 23, into a DS3/E3 frame.

The SIU 25 processes the received SR stream 30 and extracts the payload from the DS3/E3 frame. For E3 operation, the SIU 25 implements the E3 Frame Acquisition Algorithm specified in COMSAT 112-06-00013 to synchronize to the E3 frame. The ALE frame data is then transferred to the DEC 24.

In DS3 operation, the SIU 25 extracts the overhead bits listed below from the DS3 frames on the SR stream 30. The extracted overhead is then transferred by the ALECPU 21 to the TIU 22 and is then transmitted on the TR stream 28.

C13 Far-End Alarm Control bit (ITU G.804) 1 bit

C51–53 Path maintenance data link bits (ITU G.804) 3 bits

In E3 operation, the TIU 22 extracts the overhead bytes listed below from the E3 frames on the SR stream 30. The extracted overhead is then transferred by the ALECPU 21 to the TIU 22 and is then transmitted on the TR stream 28.

NR Network Operator byte (ITU G-832) 8 bits

GC General purpose communication link (ITU G.832) 8 bits

TR Trail Trace (ITU G.832) 8 bits

TM Timing Marker (ITU G.832) 1 bit

In DS3 operation, the SIU 25 receives the overhead bytes listed below from the ALECPU and transmits them in the DS3 frame overhead on the ST stream 29. The ALECPU 21 transfers these bits from the TIU 22, which extracts them from the TT stream 27.

C13 Far End Alarm Control bit (ITU G.804) 1 bit

C51–53 Path maintenance data link (ITU G.804) 3 bits

In E3 operation, the SIU 25 receives the following overhead bits from the ALECPU 21 and transmits them in the E3 frame overhead on the ST stream 29. The ALECPU 21 transfers these bits from the TIU 22, which extracts them from the TT stream 27.

NR Network Operator byte (ITU G.832) 8 bits

GC General purpose communication link (ITU G.832) 8 bits

TR Trail Trace (ITU G.832) 8 bits

TM Timing Marker (ITU G.832) 1 bit

The SIU 25 accumulates the performance monitoring data specified in Table 1, and the data will be read every second by the ALECPU 21. Additionally, in DS3 operation, the SIU 25 detects the following alarms on the SR stream and transfers the alarm information to the ALECPU 21: LOS, OOF, AIS, Idle and FERF. Further, the SIU 25 can also generate the following alarms on the ST stream 29 (as instructed by the ALECPU 21): AIS, Idle and FERF.

In E3 operation, the SIU detects the following alarms on the SR stream and transfers this information to the ALECPU: LOS, OOF, AIS and FERF. The SIU 25 can also generate the following alarms on the ST stream 29 (as instructed by the ALECPU 21): AIS and FERF.

Given the above described apparatus used to implement the present invention, the inventive methods thereby implemented are discussed as follows.

Bandwidth Efficiency

Encoding schemes currently used in wireless links provide for error correction by generating coding bytes based on the data to be protected. These coding bytes must also be transmitted over the wireless link, thus requiring extra bandwidth. The fifth (5th) byte in the header of every ATM cell is called the Header Error Correction (HEC) byte and is a checksum that is generated from the contents of the first four header bytes. In the present invention, the HEC byte is dropped at the transmitting end of the wireless link (i.e., not transmitted over the wireless link) by the Frame Assembler 41 in the Encoder 23. The dropping of the HEC byte creates extra bandwidth which is used to transmit the coding bytes, thus allowing the wireless link to operate at the same bandwidth as a terrestrial wireline link, while providing forward error correction. At the receiving end of the wireless link, the HEC byte is regenerated from the other four bytes of the ATM header and can be then transmitted on an outgoing terrestrial wireline interface to include the HEC byte.

Figure 4:
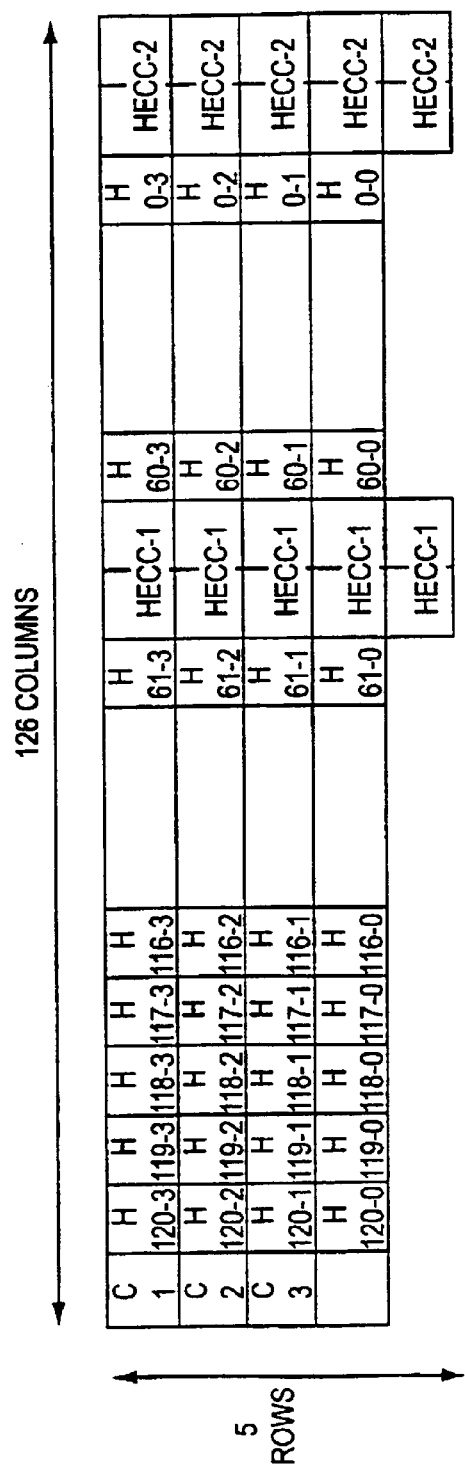
FIG. 4 illustrates the Header Frame construction.

If the errors occurring in a wireless link transmitting ATM cells affect the ATM cell header, the entire ATM cell (header and payload) has to be dropped. In order to protect the headers of the ATM cells, the present invention uses a frame structure called a Header Frame to protect from errors over a wireless link. FIG. 4 illustrates a Header Frame according to the present invention as embodied in a DS3 rate (44.736 Mbps) wireless link. The techniques of the present invention can, however, be applied equally well for transmission of ATM cells at different rates.

Header Frame Construction

A Header Frame is formed by the Frame Assembler 41 in the Encoder 23 from the headers of 121 ATM cells in an exemplary embodiment. When the HEC byte is dropped from each these headers, as discussed previously, this leaves a total of 484 bytes (4 bytes×121 cells). As shown in FIG. 4, the 121 headers are split into two sections, the first section consisting of the headers of 60 cells (Cell sequence numbers 120–61) and the second section consisting of the headers of the remaining 61 cells (Cell sequence numbers 60–0). A header made up of three control bytes (C1–C3) and one dummy byte (Hex "00") is added to the first section of the Header Frame. The dummy byte is added to the first section for symmetry and is not transmitted over the wireless link. The ATM cell headers are then arranged in a matrix with 4 rows and 122 columns, with each ATM cell header occupying a column and the control bytes occupying one column.

Each section of the Header Frame contains 244 bytes (4 bytes×61 cells). To these 244 bytes in each section are added 10 bytes of Header Error Correction Code (HECC) arranged in two columns and 5 rows as shown in FIG. 4. These 10 bytes of HECC are generated by the RSEncoder 52 in the Encoder 23 from the 244 bytes of the Header Frame using a Reed Solomon coding scheme. Thus, the total number of bytes to be transmitted in each Header Frame is 507 (2 sections×244 bytes/section+20 HECC bytes–1 dummy byte). This Header Frame structure in association with Reed Solomon coding provides increased error correction capability to the ATM cell headers and improves the Cell Loss Ratio over the wireless link.

Payload Frame Construction

Figure 5:
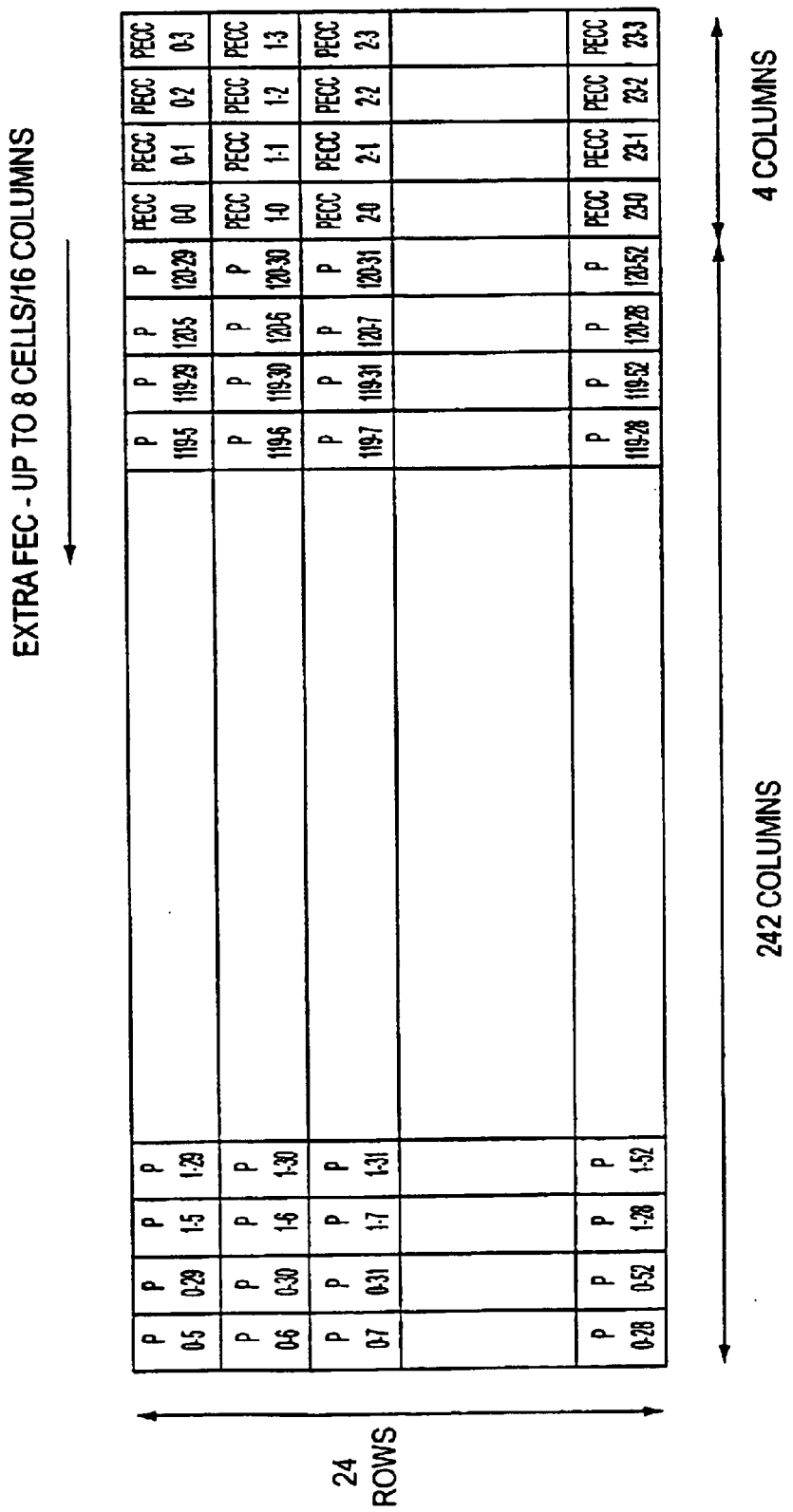
FIG. 5 illustrates the Payload Frame construction.

Similar to the Header Frame Structure, the payload of the ATM cells is also protected by assembling them in a frame called the Payload Frame via the Frame Assembler 41 in Encoder 23. FIG. 5 illustrates an exemplary embodiment of a Payload Frame according to the present invention as embodied in a DS3 rate (44.736 Mbps) wireless link. The Payload Frame is formed from the payloads of the 121 ATM cells and occupy 5808 bytes (48 bytes/cell×121 cells). These cell payloads are arranged in a matrix of 242 columns by 24 rows. Every ATM cell payload of 48 bytes occupies two columns and is spread over all the rows. The first 24 bytes of the payload are arranged in a first column allocated to it and the next 24 bytes in a second column allocated to it. Each row of the Payload Frame thus contains 242 bytes to which are added 4 bytes of Payload Error Correction Code (RECC). These bytes of PECC are arranged in 4 columns and 24 rows. The 4 bytes of PECC for every row are generated by the RSEncoder 42 in Encoder 23 using the Reed Solomon coding scheme. Although the payloads of individual ATM cells have no error correction capability built into them, the frame structure of FIG. 5 is designed to provide the payloads with error correction capability through the PECC.

Extra Payload Protection

The statistical nature of ATM transmission at high data rates results in a very high probability of finding idle/unassigned cells distributed amongst other valid cells. These idle/unassigned cells occupy valuable bandwidth if transmitted over the wireless link. According to a method of the present invention, these idle/unassigned cells are put to use for providing increased error correction capabilities for the ATM cell payload. In both the Header and Payload Frames, the first eight or fewer idle/unassigned cells available are pushed to the end of the frames by the Frame Assembler 41 in Encoder 23 when the idle/unassigned cell detection signal from the Cell Preprocessor 40 is received by the Frame Assembler 41. As illustrated in FIG. 5, when an idle/unassigned cell is moved to the end of the Payload Frame, for example, it occupies two columns on every row. These two columns provide two extra bytes of PECC for every row in the Payload Frame which are added by the RSEncoder 42 in Encoder 23. Up to eight idle/unassigned cells (16 columns) may be used in every Payload Frame to provide this extra PECC. This use of idle/unassigned cells for extra protection of the ATM cell payload has been shown to result in dramatic improvement of the Cell Error Ratio (CER) even if only 1% of the incoming ATM cells are idle/unassigned cells.

Real Time Adaptive Extra Payload Protection

In addition, providing extra bytes of PECC allows for dynamic change of coding in real time from one Payload Frame to another. The systems at both ends of the wireless link have to know in real time the number of idle/unassigned cells in every Payload Frame. This information has to be a part of the Header Frame at the transmitting end since the Payload Frame cannot be decoded without this information. Thus, this information must also be available at the receiving end prior to its processing the Payload Frame since the data from both frames is processed in real time. In another method of the invention, informing the receiving end of these dynamic real time changes in the PECC in the payload frames is accomplished by using two different information fields in the Header Frame.

Figure 6:
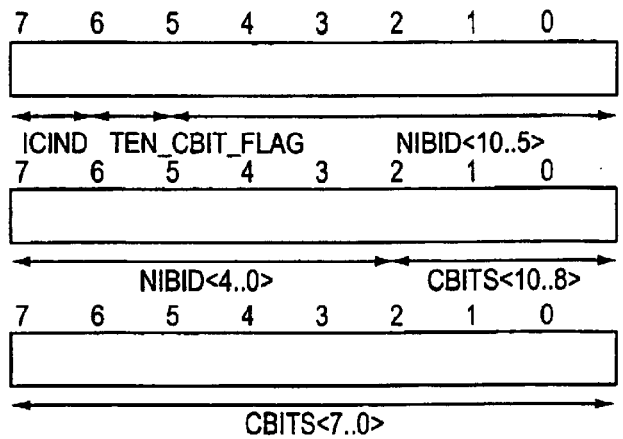
FIG. 6 illustrates the format of the control bytes added to the Header Frame shown in FIG. 4.

The first information field is a 1 bit field in Control byte 1 (C1) as illustrated in FIGS. 4 and 6 and is called the Idle Cell Indicator (ICIND). The Idle Cell Indicator is set to a "1" if the idle/unassigned cells are used for extra PECC and is set to "0" if not. As discussed previously, if idle/unassigned cells are present their headers and payloads are moved to the end of their respective frames. If the Idle Cell Indicator is set to a "1" in the Header Frame, at minimum the last cell (i.e., Cell 120) in the Header Frame must be idle/unassigned. Therefore, the cell has a known header which may be dropped at the transmitting end of the wireless link and regenerated at the receiving end of the wireless link.

The second information field is located in the second header byte of the last cell of the frame and is used to store the number of idle/unassigned cells in the frame used for Extra Payload Protection. In other words, this field is used only when ICIND is equal to "I".

At the receiving end of the wireless link, the first section of the Header Frame is processed first, followed by the second section and then the Payload Frame. Since the Idle Cell Indicator and the number of idle cells are present in the Control bytes in the first section of the Header Frame (Cells 120–61), this information is available well before the receiving end starts processing the Payload Frame.

ATM Cell Stream Sequence Restoration

Since the method of the present invention moves idle/unassigned cells to the end of the Header and Payload Frames at the transmitting end of the wireless link, the order in which the ATM cells arrive on the receiving end is disturbed and affects the Cell Delay Variation. Therefore, in order to leave the Cell Delay Variation unperturbed, a method of the invention further provides restoration of these idle/unassigned cells to their original positions in the cell stream. Restoration is accomplished by recording the original position of all idle/unassigned cells when they are moved by the Frame Assembler 41 in the Encoder 23. The first header byte in the idle/unassigned cells' new position in the Header Frame is then overwritten by the Frame Assembler 41 with the recorded value. Thus, when the Header Frame is received at the receiving end, the recorded value in the header byte is used to restore all idle/unassigned cells to their original positions in the cell stream. This technique of cell stream sequence restoration is advantageous in that it leaves the Cell Delay Variation unperturbed without using any extra bandwidth over the wireless link.

Interleaving

In a method of the invention, the series of techniques described above are used in conjunction with interleaving the Header and Payload Frames by use of the Byte Interleaver 43 in the Encoder 23. Typically wireless links exhibit transmission characteristics that result in error bursts affecting the information transmitted. Accordingly, this embodiment interleaves the Header and Payload Frames before transmission on the wireless links, transmits the frames, and then deinterleaves the frames at the receiving end. Interleaving the frames spreads the burst errors randomly over the entire Header and Payload Frames, thus making them easier to correct.

Specifically, for transmission over the wireless link every set of 121 ATM cells is assembled into the Header and Payload Frames as discussed previously and then encoded. A two byte Sync Pattern (e.g., hexadecimal "6789") is added by the Byte Interleaver 43 to every set of assembled 121 ATM cells and is also transmitted ahead of the transmission of the set of cells. The receiving end uses the Sync Pattern to synchronize to the Header and Payload Frames whose transmission immediately follow this pattern.

The interleaving technique transmits 11 bytes from the Payload Frame following every byte transmitted from the Header Frame. For example, the first byte transmitted is a byte from the second section of the Header Frame (header byte 3 of Cell 60). The Header Frame bytes being picked by going down the columns and alternating between the two sections. Every byte transmitted from the Header Frame is subsequently followed by 11 bytes from the Payload Frame. The bytes from the Payload Frame are accessed by going down the columns left to right. After the 507 bytes of the Header Frame are transmitted, the remaining 338 bytes are transmitted out consecutively. An example of the output stream is as follows:

| 2 byte Sync Pattern |
|---|
| H60-3 |
| P0-5 to P0-15 |
| Control byte 1 |
| P0-16 to P0-26 |
| H60-2 |
| P0-27 to P0-37 |
| Control byte 2 |
| P0-38 to P0-48 |
| H60-1 |
| P0-48 to P1-5 |
| Control byte 3 |
| P1-6 to P1-16 |
| H60-0 |
| P1-17 to P1-27 |
| H120-3 |
| P1-17 to P1-27 |
| H120-3 |
| P1-28 to P1-38 |
| H59-3 |
| . . . |
| H0-0 |
| P110-23 to P110-33 |
| HECC1-0 |
| P110-34 to P110-44 |
| . . . |
| HECC1-9 |
| P114-40 to P114-50 |
| HECC2-9 |
| P114-51 to P120-52 |
| PECC0-0 to PECC23-3 |

End to End Overhead Bits Preservation

Framing structures used for terrestrial wireline interfaces (e.g., DS3, E3) have certain overhead parity bits present in the frame which are used for end to end monitoring. These bits are generated based on the Payload contained in the frame. Further, these bits must be transferred transparently from one end to the other so the information received is the same as that transmitted. In another method of the invention a technique is used to synchronize the payloads between the two ends and to transfer these overhead bits across the wireless link for restoration at the other end. This technique is illustrated as embodied in a DS3 rate (44.736 Mbps) wireless link frame for C-Bit Parity (i.e., CP bits).

At DS3 rates, ATM cells are nibble aligned to the payload of a DS3 frame. When extracting the ATM data from every DS3 frame on the terrestrial wireline interface, the first nibble from that frame is flagged by the TIU 22. When the Header and Payload Frames are assembled, the position of the first flagged nibble that is encountered in every set of 121 ATM cells is recorded in the Control bytes (e.g., C1 and C2 as shown in FIG. 6). This position, called NIBID, is encoded in 11 bit binary with 4 bits for the cell number, 6 bits for the byte number inside the cell and 1 bit for the significance of the nibble. This significance bit is set to logic level "1" if the flagged nibble is the more significant nibble in the corresponding byte of the ATM cell and is set to "0" otherwise.

Every set of 121 ATM cells arrives on the incoming terrestrial wireline interface spread over either 10 or 11 DS3 frames. For every DS3 frame, the three CP bits standard to the DS3 format are extracted. These bits all have the same value, so only the first bit is transferred over the wireless link. This transfer is accomplished using two fields in the Control bytes. The first is an 11 bit field called CBITS which stores all the CP bits and the second is a 1 bit field called TEN_CBIT_FLAG as shown in FIG. 6.

While assembling the Header and Payload Frames for every set of 121 ATM cells, the CP bits for each "contained" DS3 frame are recorded. The DS3 frames that are "contained" in a 121 ATM cell set are defined as the DS3 frames whose first payload nibble is present amongst those 121 ATM cells. The most significant bit of CBITS corresponds to the first contained DS3 frame and the least significant bit of CBITS corresponds to the last contained DS3 frame. There can be either 10 or 11 contained DS3 frames in any ALE frame. If an ALE frame has only 10 contained DS3 frames, the most significant 10 bits of CBITS are used and the least significant bit is set to "0" and TEN_CBIT_FLAG is set to a "1". If 11 contained DS3 frames are found, TEN_CBIT_FLAG is set to 0.

At the receiving end of the wireless link NIBID, CBITS and TEN_CBIT_FLAG fields are used to restore the CP bits to the outgoing terrestrial wireline interface. This is accomplished by the following algorithm.

The Cell Assembler 53 in Decoder 24 starts in an Initial mode. In Initial mode, the Cell Assembler 53 extracts the NIBID to obtain the position of the first nibble of the payload of the first complete DS3 frame in the first received ALE frame. Cell Assembler 53 then starts transmission of cell data to the TIU starting at the nibble identified by NIBID. This nibble is the first nibble in the payload of a new DS3 frame transmitted on the TR stream 28. This process is repeated every ALE Frame until it enters Normal mode.

In Normal mode, the Cell Assembler 53 continuously transmits the cell data starting at the first nibble of the ALE Frame. The Cell Assembler 53 exits the Normal mode and reenters Initial mode only when it loses synchronization.

Cell Assembler 53 verifies that it is in synchronization through two methods. The first method uses the NIBID derived from one ALE frame while Cell Assembler 53 is in the Initial mode and calculates an expected NIBID for the next ALE Frame. The Cell Assembler 53 compares this calculated value to the NIBID received in the next ALE Frame. If the values match, the Cell Assembler 53 enters Normal mode, otherwise it remains in Initial mode. When the Cell Assembler 53 enters Normal mode, it continues to calculate the expected NIBID value to the NIBID value received. On three consecutive comparison mismatches, the Cell Assembler 53 returns to Initial mode.

The second method for verifying synchronization begins with the Cell Assembler 53 checking during every ALE Frame, at the start of the first DS3 frame (as indicated by the TIU 22), its internal counters and verifies that they are pointing to the cell, byte and nibble indicated by NIBID. This check is performed only in Normal mode, and on three consecutive verification failures the Cell Assembler 53 returns to Initial mode.

In Initial mode, the Cell Assembler 53 extracts the most significant bit of the CBITs field in the Control bytes and transmits it on the CP bit positions in the DS3 overhead of the new DS3 frame on the TR stream 28. Cell Assembler 53 monitors the start of DS3 frame indication from the TIU 22 and transmits the corresponding CP bit from every DS3 frame.

In Normal mode, the Cell Assembler 53 uses the information in the TEN_CBIT_FLAG field of the Control bytes for the correct reinsertion of the CP bits. The Cell Assembler 53 monitors the start of DS3 frame indications remaining in the ALE Frame (9 or 10 as indicated by TEN_CBIT _FLAG) and extracts their corresponding CP bits and transfers them to the TIU 22. After transmitting all 10 or 11 bits of the CP bits for that frame, the Cell Assembler 53 loads the CBITS field for the next ALE Frame and repeats the process.

ATM Cell Header Error Detection/Correction

Another aspect of the present invention is that the headers of all ATM cells received on the incoming stream are checked for errors. This is accomplished by generating a syndrome for the five bytes of the header. The syndrome is the remainder of the division (modulo 2) by the generator polynomial $x^8+x^2+x+1$ of the product of $x^8$ multiplied by the contents of the first four bytes of the ATM cell header and the HEC byte after subtracting binary 01010101 from the HEC byte. If there is a single bit in error in the header the syndrome will indicate the errored bit and a correction is performed. If there are multiple bits in error in the header as indicated by the syndrome, the whole ATM cell is dropped and replaced by an idle/unassigned cell.

Decoding Received Encoded ATM Cells

Figure 7:
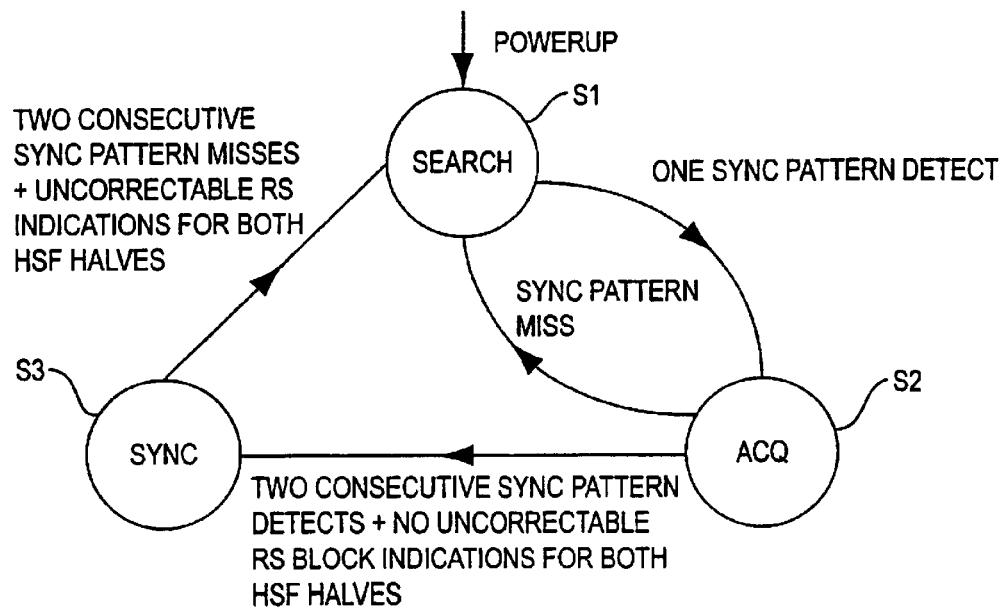
FIG. 7 is a state diagram of the Acquisition and Synchronization Procedure followed by the Acquisition and Synchronization Unit shown in FIG. 3.

As illustrated by the state diagram in FIG. 7, ASU 50 of the Decoder 24 shown in FIG. 3 accomplishes acquisition and maintenance of an ALE frame by first entering a Search mode S1 in which ASU 50 sets a pattern search window open to look for the Sync pattern in all the data received from the SIU 25. The ASU 50 searches for a perfect match (zero errors) to the two byte Sync pattern in the incoming data which has been appended to the ALE frame by a byte Interleaver on the transmitting end. Upon finding a perfect match, ASU 50 enters into an Acquisition mode S2.

Figure 8:
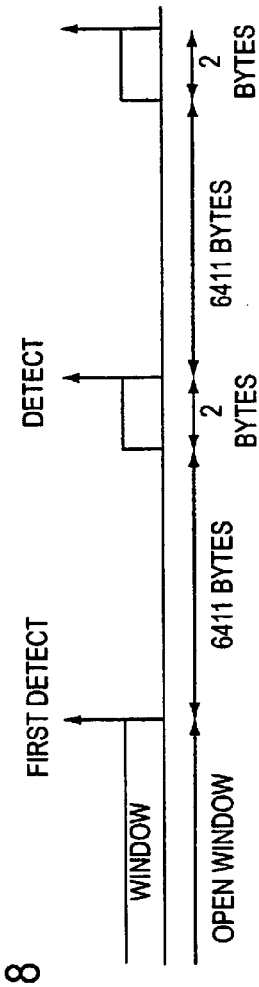
FIG. 8 illustrates the pattern search window used by the Acquisition and Synchronization Unit shown in FIG. 3.

In Acquisition mode S2, ASU 50 searches for the Sync pattern within a pattern search window. As shown in FIG. 8, the start of the first pattern search window is set to 6411 bytes from the Sync pattern detect in Search mode. Each subsequent window is started 6411 bytes from the previous Sync pattern detection and is set to a width of two bytes. ASU 50 declares a Sync pattern detect if the two bytes of data under the window are a perfect match to the Sync pattern. In this mode, data received in the previous frames is passed to the Byte Deinterleaver 51 and the RSDecoder 52, shown in FIG. 3. If the number of Bytes in error as a result of transmission via satellite exceeds the correction capability of the HECC, the RSDecoder 52 declares the corresponding Reed-Solomon coded block (i.e., one of the two Header Frame sections) to be uncorrectable.

If ASU 50 receives two consecutive Sync pattern detects and does not receive any uncorrectable Reed-Solomon coded block indications for either section of the Header Frame, ASU 50 enters Synchronization mode S3. In the Synchronization mode, ASU 50 declares a Sync pattern detect if the pattern under the window has no errors when compared to the Sync pattern. ASU 50 continues to generate pattern detect windows and checks to ensure it receives Sync pattern detects under the pattern detect windows. If ASU 50 misses two consecutive Sync pattern detects and receives uncorrectable Reed Solomon block indications for the first and second sections of the Header Frame, it returns to Search mode S1. Thus, Synchronization mode ensures that no errored cells are transmitted to the terrestrial network via the TIU 22.

Next, the Byte Deinterleaver 51 receives the interleaved data from ASU 50. The Byte Deinterleaver 51 then deinterleaves the data and rearranges it as an ALE frame. The ALE frames are then passed to the RSDecoder 52 which checks the HECC using the Reed-Solomon coding scheme and corrects any errors detected in the Header Frame. If the number of errors in either section of the Header Frame exceeds the correction capability of the HECC, a Reed-Solomon block error indication is declared. This indication is also used by ASU 50 as discussed previously. If either section of the Header Frame is found uncorrectable, the cells whose headers are present in that section are replaced by idle/unassigned cells. This ensures that no cells with incorrect headers are transmitted to the terrestrial network, thus reducing cell misinsertion errors.

In addition, the RSDecoder 52 checks the three Control bytes in the Header Frame to determine if idle/unassigned cells were used in the PECC in the Payload Frame. If so, the RSDecoder reads ICNUM from header byte 2 of the 121st cell. Next, the RSEncoder 52 proceeds to read header byte 1 of the last ICNUM cells in the Header Frame and forms a table of the sequence numbers of these idle/unassigned cells. If idle/unassigned cells are used for the PECC, header bytes 0 and 3 of these cells are also present in the ALE frame. These header bytes are read and added to the above mentioned table of sequence numbers. When assembling unassigned cells, the Cell Assembler 53 inserts these into header bytes 0 and 3 of the unassigned cells transmitted on the TR stream. The Cell Assembler 53 uses the above mentioned table and reinserts idle/unassigned cells into the correct positions in the ALE Frame, thus restoring exactly the order in which the cells arrived on the terrestrial transmit (i.e., TT) stream at the transmitting end.

The Cell Assembler 53 then selects out the 4 header bytes and the 48 bytes of payload for all 121 cells in the ALE Frame. In turn, the Cell Assembler 53 regenerates the dropped HEC byte using the remaining 4 header bytes and reinserts it as the fifth byte in the header. Finally, the Cell Assembler 53 passes the assembled cell data to the TIU 22 to be framed and transmitted on the TR stream 28.

While several particular forms of the invention have been illustrated and described, it will be apparent that various modifications can be made without departing from the spirit and scope of the invention.

What is claimed is:

1. A method for encoding ATM cells for transmission over a wireless link comprising the steps of:
   receiving an ATM cell stream comprised of a plurality of ATM cells;
   detecting idle/unassigned cells within said cell stream;
   assembling a header frame made up of headers of a number of said plurality of ATM cells;
   assembling a payload frame made up of payloads of said number of said plurality of ATM cells; and
   placing some of the detected idle/unassigned cells in a selected portion of the payload frame.

2. A method according to claim 1 wherein said header frame arranged in an i row× n column matrix.

3. A method according to claim 1 wherein said payload frame is arranged in an j row× m column matrix.

4. A method according to claim 1, wherein said step of assembling said header frame further comprises:
   partitioning said header frame comprised of headers of an n number of ATM cells into a first section and a second section;
   said first section comprised of n−x number of headers of said n number of ATM cells and an added cell made up of control bytes; and
   said second section comprised of x number of headers of said n number of ATM cells.

5. A method according to claim 1, wherein said step of assembling said header frame further comprises:
   adding a predetermined number of bytes of Header Error Correction Code (HECC) to said header frame.

6. A method according to claim 5, wherein said Header Error Correction Code is generated using a Reed-Solomon coding scheme.

7. A method according to claim 1, wherein said step of placing idle/unassigned cells further comprises:
   adding extra Payload Error correction code in any idle/unassigned cells which are placed in said selected portion of said payload frame.

8. A method according to claim 1, wherein said step of assembling said payload frame further comprises:
   adding a predetermined number of bytes of Payload Error Correction Code (PECC) to said payload frame.

9. A method according to claim 8, wherein said Payload Error Correction Code is generated by a Reed-Solomon coding scheme.

10. A method for transmitting ATM cells received from a wireline interface over a wireless link comprising:
    receiving an ATM cell stream comprised of a plurality of ATM cells from said wireline interface;
    encoding said plurality of ATM cells, wherein said encoding step includes the steps of:
    detecting idle/unassigned cells within said cell stream,
    assembling a header frame made up of headers of a first predetermined number of said plurality of ATM cells arranged in a first matrix,
    assembling a payload frame made up of payloads of said first predetermined number of said plurality of ATM cells arranged in a second matrix, and
    placing up to a second predetermined number of the detected idle/unassigned cells to an end of the payload and header frames, starting with a last column of each of said frames; and
    transmitting said predetermined number of said plurality of ATM cells over said wireless link by interleaving said header frame and said payload frame.

11. A method according to claim 10, said step of transmitting further comprising:
    interleaving by transmitting a third predetermined number of bytes from said payload frame for every byte transmitted from said header frame.

12. A method according to claim 10, said step of transmitting further comprising:
    adding a two byte synchronizing pattern to said header and payload frames.

13. A method for storing information to be used by a receiving end of a wireless link relating to dynamic real time changes in encoding between an ATM frame to be transmitted over said wireless link and a subsequent ATM frame to be transmitted over said wireless link comprising:
    encoding a plurality of ATM cells within an ATM cell stream, wherein said encoding step includes the steps of:
    detecting idle/unassigned cells within said cell stream,
    assembling an ATM frame having a header frame made up of headers of a first predetermined number of said plurality of ATM cells and a payload frame made up of payloads of said first predetermined number of said plurality of ATM cells,
    placing up to a second predetermined number of the detected idle/unassigned cells in a selected portion of the payload frame, and
    adding Payload Error Correction Code to those idle/unassigned cells which are placed in said selected portion of said payload frame; and
    storing an idle/unassigned cell indicator in a first control byte in said header frame to be transmitted over said wireless link which indicates whether or not idle/unassigned cells have been placed at said selected portion of said payload frame; and
    storing a count of the number of idle/unassigned cells contained in the payload frame in a second control byte within said header frame.

14. A method for recording information to be used at a receiving end of an ATM wireless link relating to original positions of moved idle/unassigned cells in an ATM frame, comprising:
    recording original positions of idle/unassigned cells as they occur in a cell stream made up of a predetermined number of ATM cells used to assemble said ATM frame having a header frame and a payload frame;
    moving idle/unassigned cells to new positions at a selected portion of said ATM frame; and
    overwriting header bytes of each moved idle/unassigned cell with the recorded original positions of each corresponding moved idle/unassigned cell.

15. A method for preserving overhead parity bits present in each of a plurality of received ATM frames which are to be transmitted over a wireless link comprising:
    flagging a first nibble occurring in each of said plurality of ATM frames received;

assembling header and payload frames for transmission over said wireless link consisting of a predetermined number of ATM cells derived from said plurality of ATM frames;

recording a position of each said first flagged nibble encountered in each said predetermined number of ATM cells in control bytes contained in said header frame; and storing said overhead parity bits occurring in each of said plurality of ATM frames in control bytes contained in said header frame.

16. A method for decoding interleaved and encoded data transmitted and received over a wireless link comprising:

deinterleaving said data and rearranging said data into a predetermined frame;

decoding data according to a predetermined coding scheme;

detecting if any cells within a Header frame within said predetermined frame are uncorrectable; and replacing detected uncorrectable cells with idle/unassigned cells, wherein said step of rearranging said data further comprising:

checking control bytes contained with said Header frame to determine whether or not idle/unassigned cells were utilized for error correction in a Payload Frame within said predetermined frame;

reading a plurality of header bytes within said Header frame and forming a table of sequence numbers based upon said read header bytes;

reinserting idle/unassigned cells into said correct positions in said predetermined frame based upon said table of sequence numbers thereby restoring an order of cells occurring at a transmitting end of said wireless link.

* * * * *